United States Patent
Takada et al.

(10) Patent No.: US 6,674,334 B1
(45) Date of Patent: Jan. 6, 2004

(54) OSCILLATOR HAVING SURFACE ACOUSTIC WAVE RESONATOR AND OSCILLATION CIRCUIT

(75) Inventors: Yutaka Takada, Minami-Minowa-mura (JP); Takashi Endo, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/689,654

(22) Filed: Oct. 13, 2000

(30) Foreign Application Priority Data

Dec. 2, 1999 (JP) .......................................... 11-343263

(51) Int. Cl.[7] ................................................ H03B 5/12
(52) U.S. Cl. .............................. 331/107 A; 331/108 C; 331/117 V; 331/36 C; 331/177 R; 375/306; 332/102; 332/100
(58) Field of Search ................................. 332/102, 100; 331/107 A, 108 C, 177 V, 36 C, 177 R; 455/76; 375/306

(56) References Cited

U.S. PATENT DOCUMENTS

| | | | |
|---|---|---|---|
| 4,010,428 A | 3/1977 | Sunkler | 331/117 R |
| 4,021,756 A | 5/1977 | Podowski et al. | 331/117 R |
| 4,544,897 A | 10/1985 | Kleinberg | 331/116 R |
| 4,581,592 A * | 4/1986 | Bennett | 331/107 A |
| 4,761,616 A | 8/1988 | Ash | 331/107 A |
| 4,873,498 A | 10/1989 | Kleinberg | 331/116 FE |
| 5,329,256 A * | 7/1994 | Higgins, Jr. | 331/107 A |
| 5,367,537 A * | 11/1994 | Anderson | 332/102 X |

FOREIGN PATENT DOCUMENTS

| | | |
|---|---|---|
| JP | 61-112144 | 5/1986 |
| JP | 01-085519 | 4/1989 |
| JP | 04-059754 | 2/1992 |
| JP | H04-94829 | 8/1992 |
| JP | 05-306168 | 12/1993 |
| JP | 08-210037 | 8/1996 |
| JP | 08-229327 | 8/1996 |
| JP | 09-361562 | 12/1997 |
| JP | 10-088279 | 3/1998 |
| JP | A-11-17747 | 1/1999 |
| JP | 11-264851 | 9/1999 |
| JP | 11-300159 | 10/1999 |

OTHER PUBLICATIONS

Hiroaki Tanaka et al., "SAW Oscillator Multi–Chip Module for 300 MHz Low Power Radio", Proceedings of the 1997 IEEE International Frequency Control Symposium. Orlando, FL, May 28–30, 1997, IEEE International Frequency Control Symposium, New York, NY: IEEE, US, May 28, 1997, pp. 836–840, XP000849600.

* cited by examiner

Primary Examiner—Arnold Kinkead
(74) Attorney, Agent, or Firm—Oliff & Berridge, PLC

(57) ABSTRACT

An oscillator is provided that can be flexibly retrofitted to become usable for a wide range of applications, that is compatible with different users' requests, and that enables a user to design a high-frequency unit using the oscillator without concerns. The oscillator includes a SAW resonator and an oscillation unit provided in the form of an integrated circuit. The SAW resonator and oscillation unit are encapsulated in the same package and then sealed. The whole oscillator is thus provided in the form of a module. The oscillation circuit includes a first adjustment terminal with which a current flowing through a current source is adjusted externally. A resistor offering a desired resistance is connected between the first adjustment terminal and a ground terminal, whereby a negative resistance can be adjusted. Moreover, a second adjustment terminal with which a current flowing through a current source in an amplification circuit is included. Another resistor whose resistance permits an output of a desired intensity is connected between the second adjustment terminal and a ground terminal. Thus, the intensity of the output can be adjusted.

9 Claims, 7 Drawing Sheets

OSCILLATOR HAVING SURFACE ACOUSTIC WAVE RESONATOR AND OSCILLATION CIRCUIT

BACKGROUND OF THE INVENTION

1. Field of Invention

The present invention relates to an oscillator adaptable to various types of wireless remote control systems or various types of information processing systems, or more particularly, to an oscillator employing a surface acoustic wave resonator. The wireless remote control systems are usable to, for example, remotely manipulate various kinds of electronic equipment, or adaptable to a key-entry system for remotely opening or closing a door lock of a motor car.

2. Description of Related Art

The invention disclosed in, for example, Japanese Unexamined Patent Publication Application No. 11-17747 is known as one of related arts.

According to the related art, a transmitter for a key-entry system that serves as a communicator is constructed using a frequency-shift keying (FSK) modulator. Consequently, adjustment of a frequency and assembling of components are simplified, the costs of machining are reduced, and a low price is realized.

SUMMARY OF THE INVENTION

In the related art described above, the FSK modulator handles a single frequency. For realizing an FSK modulator for handling another frequency, all constants set in circuits must be corrected or reviewed accordingly. This can be inconvenient.

Moreover, according to the related art, a frequency band and communication method permitting the oscillator to act as a communicator are limited to specific ones. The oscillator may therefore be unusable for a wide range of applications.

Furthermore, according to the related art, an adjustment step at which a trimming pattern is employed is included in a manufacturing process. Mass-produced products must be adjusted one by one. This may pose a problem in that an increase in the costs of manufacturing is invited.

Furthermore, the related art has been devised on the assumption that an oscillator must meet the specifications defined by a specific user. This may pose a problem in that the oscillator cannot be flexibly and immediately retrofitted to be compatible with the specifications defined by various users (resonant frequency, transmission power, current consumption, etc.).

Accordingly, an object of the present invention is to at least provide an oscillator capable of being flexibly retrofitted to become usable for a wide range of applications and to become compatible with specifications defined by various users. Moreover, a user can adopt the oscillator without concern when designing a high-frequency unit. Besides, the oscillator enables saving of an occupied space and a reduction in costs.

According to an exemplary embodiment of this invention, an oscillator has at least a surface acoustic wave (SAW) resonator and an oscillation circuit for causing the SAW resonator to oscillate. The oscillator includes a negative resistance varying device for varying a negative resistance that affects the oscillations of the oscillation circuit, and an oscillatory output varying device for varying the intensity of an output of the oscillation circuit.

According to another exemplary embodiment, the negative resistance varying device included in the oscillator set forth above makes it possible to externally and independently adjust a reactance, which is offered by a reactive circuit and affects the oscillations of the oscillation circuit, and a current flowing through the oscillation circuit.

According to another exemplary embodiment, the reactive circuit included in the oscillator set forth above has a variable capacitive element as an integral part thereof.

According to another exemplary embodiment, the oscillation circuit included in the oscillator set forth above has a reactive circuit included in an oscillatory loop, which is realized in the form of an integrated circuit. Moreover, a reactance offered by the reactive circuit can be adjusted arbitrarily externally.

According to the above exemplary embodiments, the oscillator includes a negative resistance varying device for varying a negative resistance that affects the oscillations of the oscillation circuit, and an oscillatory output varying device for varying the intensity of an output of the oscillation circuit. Consequently, the negative resistance and the intensity of an oscillatory output can be optimized independently of each other at a user-requested resonant frequency. According to the above exemplary embodiments, the oscillator can be flexibly retrofitted to become usable for a wide range of applications and to become compatible with users' different requests.

The oscillation circuit above has the reactive circuit, which is realized in the form of an integrated circuit, included in the oscillatory loop. Moreover, the reactance of the reactive circuit can be adjusted externally arbitrarily. Consequently, a user can optimize the negative resistance of the oscillation circuit. Moreover, since the reactive circuit included in the oscillatory loop is realized in the form of an integrated circuit, a highly reliable oscillator can be realized to be unsusceptible to a stray capacitance introduced by any of circuit elements laid out according to a user-specific pattern. Furthermore, a user can design a high-frequency unit without concern, and will find the oscillator very helpful.

According to another exemplary embodiment, the oscillation circuit included in the oscillator set forth above has a modulating device for modulating an oscillatory output of the oscillation circuit according to a modulating signal.

According to another exemplary embodiment, a modulation form adopted by the modulating device included in the oscillator set forth above is at least one of the amplitude-shift keying (ASK) form and the frequency-shift keying (FSK) form.

According to the above exemplary embodiments, the inclusion of the modulating device provides the oscillator with the capability of a transmitter. Consequently, a low-cost oscillator usable for a wide range of applications can be provided for users.

According to another exemplary embodiment, the oscillation circuit included in the oscillator set forth above includes in an output stage thereof an output matching device for matching the impedance of the oscillator with the impedance of an external device.

According to the above exemplary embodiment, the output matching device for matching the electrical characteristic of the oscillator with that of an antenna is included in addition to the modulating device. The capability of a transmitter is improved.

According to another exemplary embodiment, the oscillation circuit in the oscillator set forth above includes in the output stage thereof a frequency multiplying device for multiplying the frequency of an output.

According to the above exemplary embodiment, the frequency multiplying device is included in addition to the modulating device. An oscillator oscillating in a wider frequency band, obviating user's concern about designing, costing low, and being adaptable to a wide range of markets can be provided.

According to another exemplary embodiment, in the oscillator set forth above, among the SAW resonator, the oscillation circuit, the modulating device, the output matching device, and the frequency multiplying device, at least the SAW resonator, the oscillation circuit, and the modulating device are encapsulated in the same package.

According to the above exemplary embodiment, all the components are encapsulated in the same package. An oscillator or a transmitter can be realized with an occupied space and costs saved.

According to another exemplary embodiment, in the oscillator set forth above, among the SAW resonator, the oscillation circuit, the modulating device, the output matching device, and the frequency multiplying device, at least the SAW resonator, the oscillation circuit, and the modulating device are integrated into one circuit and encapsulated in the same package. The integration may result in an integrated circuit (IC) or a hybrid IC.

According to the above exemplary embodiment, predetermined components are integrated into one circuit and encapsulated in the same package. An oscillator or transmitter can be realized with an occupied space and costs saved.

DETAILED DESCRIPTION OF PREFERRED EMBODIMENTS

Exemplary embodiments of the present invention will be described with reference to the drawings below.

The components of an oscillator in accordance with a first exemplary embodiment of the present invention will be described with reference to the circuit diagram of FIG. 1.

Figure 1:
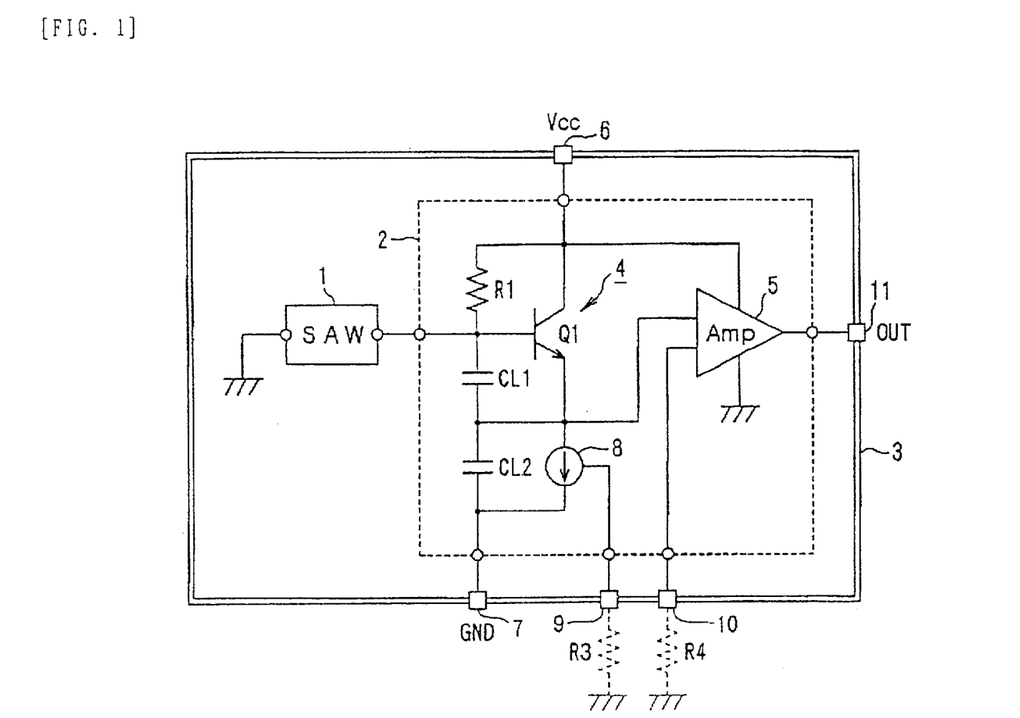
FIG. 1 is a circuit diagram showing the circuitry of an oscillator in accordance with the first exemplary embodiment of the present invention.
Figure 2:
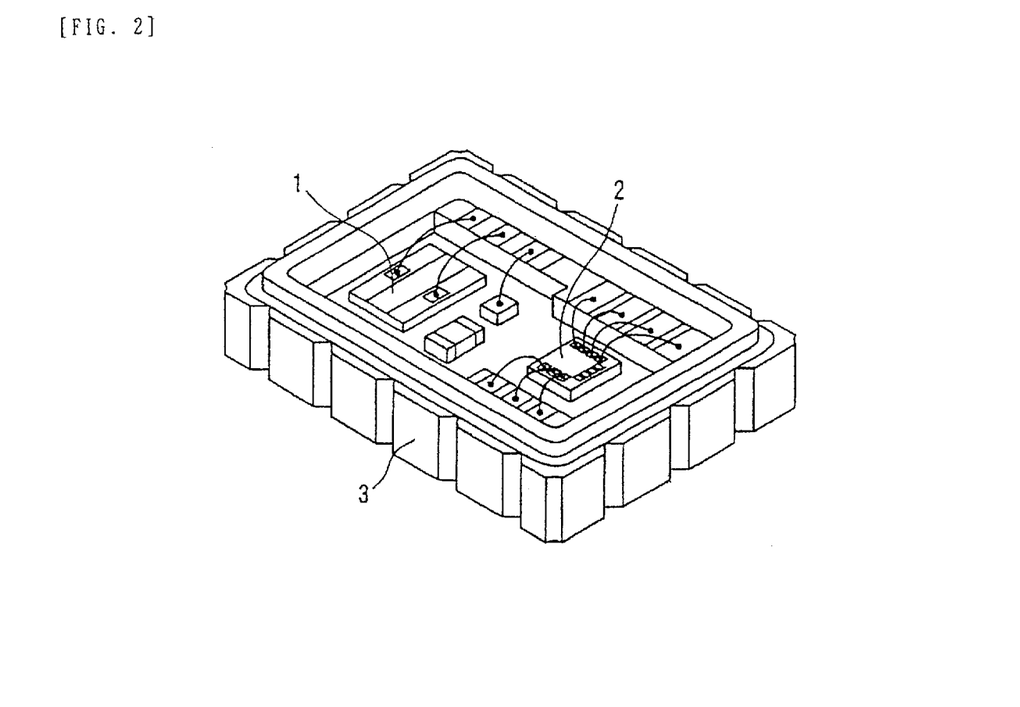
FIG. 2 is an oblique view showing an example of the oscillator in accordance with the first exemplary embodiment having an SAW resonator and an oscillator thereof encapsulated in a package.

An oscillator in accordance with the first exemplary embodiment has, as shown in FIG. 1, a surface acoustic wave (SAW) resonator 1, and an oscillation unit 2 realized in the form of an integrated circuit (IC). The SAW resonator 1 and oscillation unit 2 are stowed in the same package (casing) 3, sealed, and thus provided as a module. The oscillation unit 2 consists of an oscillation circuit 4 for causing the SAW resonator I to oscillate, and an amplification circuit 5 for amplifying an output of the oscillation circuit 4.

The SAW resonator 1 has one terminal thereof grounded and the other terminal thereof connected to the base of a transistor Q1 of the oscillation circuit 4 that will be described later.

The oscillation circuit 4 is realized with a Colpitts oscillation circuit having the transistor Q1. Specifically, a bias resistor R1 is connected between the base and collector of the transistor Q1. A capacitor CL1 for oscillation is connected between the base and emitter of the transistor Q1. A capacitor CL2 for oscillation is connected between the emitter of the transistor Q1 and a ground terminal 7. The transistor Q1 has the collector thereof connected to a power supply terminal 6. A current source 8 is connected between the emitter of the transistor Q1 and the ground terminal 7.

The oscillation circuit 4 has a negative resistance varying device for varying a negative resistance that affects oscillations. The negative resistance varying device includes an adjustment terminal 9 with which a current flowing through the current source 8 is varied externally. When a resistor R3 offering a desired resistance is connected between the adjustment terminal 9 and a ground terminal, the negative resistance can be adjusted (varied) arbitrarily.

The amplification circuit 5 has, as shown in FIG. 1, the input terminal thereof connected to the emitter of the transistor Q1 and has the output terminal thereof connected to an output terminal 11. A voltage is applied to the amplification circuit 5 through the power supply terminal 6.

Figure 3:
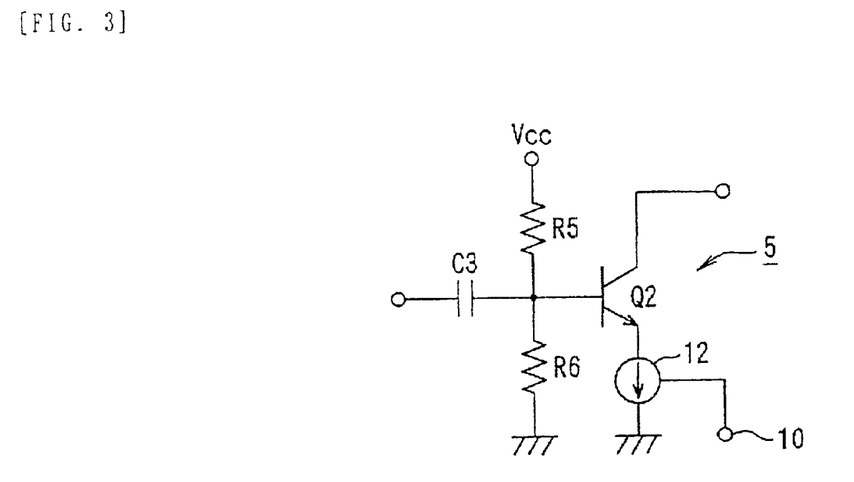
FIG. 3 is a circuit diagram showing a practical example of an amplification circuit shown in FIG. 1.

The practical circuit elements of the amplification circuit 5 will be described with reference to FIG. 3. The amplification circuit 5 is an open-collector circuit having a transistor Q2. As illustrated, a bias resistor R5 is connected between the base of the transistor Q2 and a power supply Vcc. A bias resistor R6 is connected between the base of the transistor Q2 and a ground terminal. A current source 12 is connected between the emitter of the transistor Q2 and a ground terminal. An input signal is applied to the base of the transistor Q2 via a coupling capacitor C3, and an output signal is fed through the collector of the transistor Q2.

The amplification circuit 5 has an output intensity varying device for varying the intensity of an output of the oscillation circuit 4. The output intensity varying device includes an adjustment terminal 10 with which a current flowing through the current source 12 included in the amplification circuit 5 is varied externally. As shown in FIG. 1, a resistor R4 offering a resistance that permits an output with a desired intensity is connected between the adjustment terminal 10 and a ground terminal, whereby the intensity of the output can be varied (adjusted).

The power supply terminal 6, ground terminal 7, adjustment terminals 9 and 10, and output terminal 11 are partly bared on the periphery of the package 3.

An example of the action of the oscillator in accordance with the first exemplary embodiment having the foregoing components will be described with reference to the drawings.

When a supply voltage Vcc is supplied to the power supply terminal 6, the oscillation circuit 4 starts oscillating. An output of the oscillation circuit 4 is amplified by the amplification circuit 5, and provided through the output terminal 11. For designing the amplification circuit 5 capable of amplifying the output up to a desired intensity, the resistor R4 whose resistance permits the desired intensity of the output is connected between the adjustment terminal 10 and ground terminal.

Figure 4:
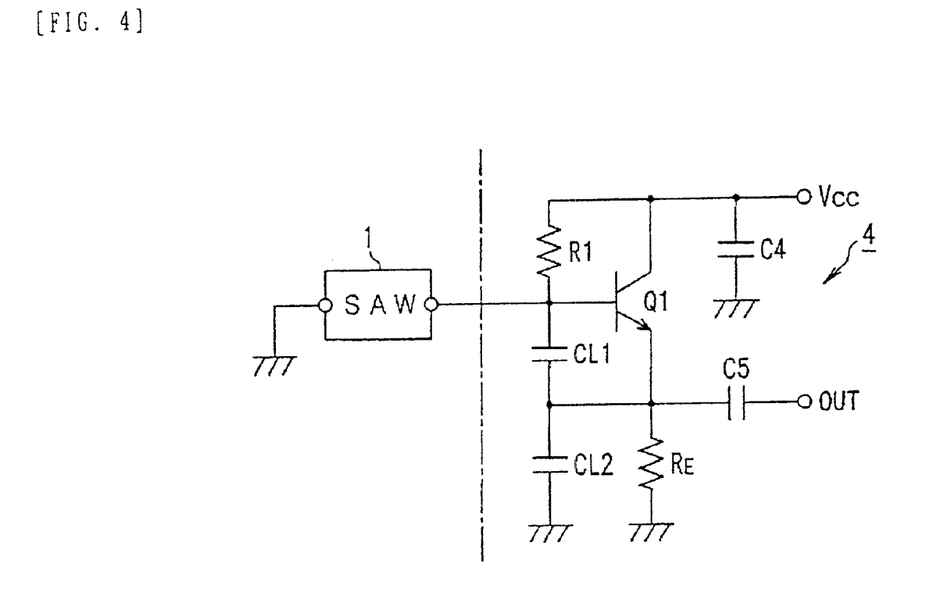
FIG. 4 is an explanatory diagram showing only the SAW resonator and oscillation circuit shown in FIG. 1.

Now, actions performed with the oscillation circuit 4 retained in a steady state (when the oscillation circuit 4 is oscillating on a stable basis) will be described with reference to FIG. 4. The circuitry shown in FIG. 4 includes only the SAW resonator 1 and oscillation circuit 4 shown in FIG. 1. The circuitry is substantially identical to a corresponding portion of the circuitry shown in FIG. 1. However, differences of the circuitry shown in FIG. 4 lie in that a resistor RE equivalent to the current source 8 is connected between the emitter of the transistor Q1 and the ground terminal, and that an ac bypass capacitor C4 and a coupling capacitor C5 are added.

Figure 5:
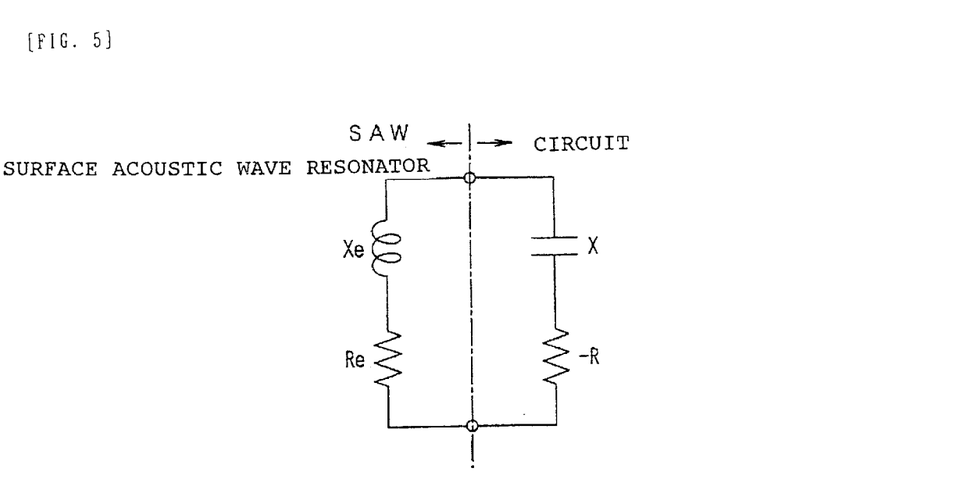
FIG. 5 shows an equivalent circuit of the circuit shown in FIG. 4.

FIG. 5 shows an equivalent circuit in which the oscillation circuit 4 is oscillating on a stable basis.

In FIG. 5, Xe denotes an equivalent reactance exhibited by the SAW resonator 1, Re denotes an equivalent resistance exhibited by the SAW resonator 1, X denotes a reactance (load capacitance) exhibited by the oscillation circuit, and −R denotes a negative resistance exhibited by the oscillation circuit.

When the oscillation circuit 4 is oscillating on a stable basis, the relationship between the reactance Xe of the SAW resonator 1 and the reactance X of the oscillation circuit is expressed as an equality (1). The relationship between the equivalent resistance Re of the SAW resonator and the negative resistance $|-R|$ of the oscillation circuit is expressed as an equality (2).

$$Xe = -X \quad (1)$$

$$Re = |-R| \quad (2)$$

The equality (1) is referred to as a phase condition, and the equality (2) is referred to as an amplification condition. For stabilizing the oscillations of the oscillation circuit 4, the negative resistance $|-R|$ thereof must meet a condition expressed with an inequality (3) below.

$$|-R| > Re \quad (3)$$

It is known that the negative resistance $|-R|$ must be three to five times larger than the equivalent resistance Re of the SAW resonator. The negative resistance $|-R|$ is expressed as an equality (4) described below.

$$|-R| = -[gm/(\omega^2 \times CL1 \times CL2)] \quad (4)$$

where gm denotes a transconductance of the oscillation transistor Q1, and ω denotes an angular resonant frequency. The relationship of $\omega = 2\pi f$ (where f denotes a resonant frequency) is established. Moreover, CL1 and CL2 denote the capacitances of the capacitors CL1 and CL2.

The equality (4) demonstrates that the negative resistance $|-R|$ is inversely proportional to the square of the resonant frequency f. The negative resistance and resonant frequency have the relationship shown in FIG. 6.

Figure 6:
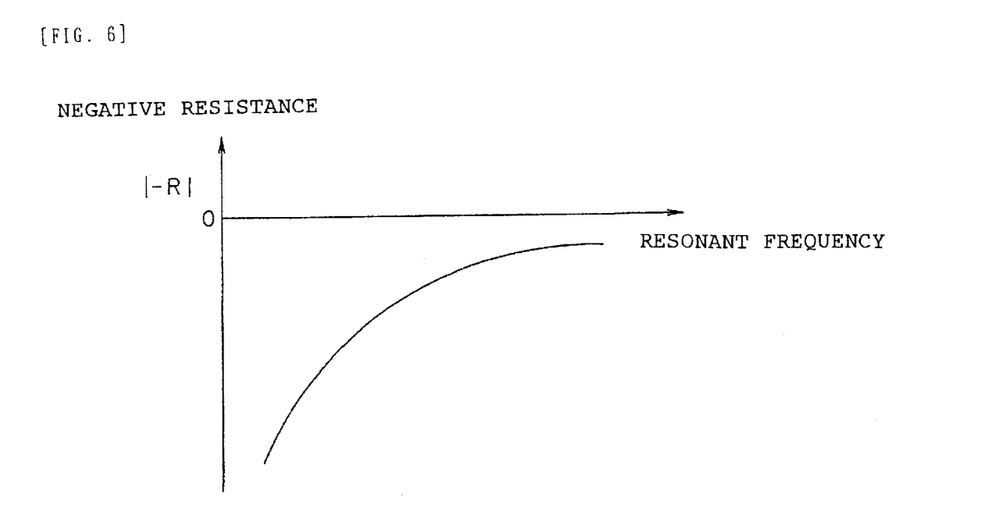
FIG. 6 shows the relationship between the resonant frequency and negative resistance of the circuit shown in FIG. 4.

As apparent from FIG. 6, as the resonant frequency f increases, the negative resistance $|-R|$ becomes smaller while being inversely proportional to the square of the resonant frequency. For ensuring a large negative resistance $|-R|$, as apparent from the equality (4), the transconductance gm of the transistor Q1 and the load capacitances of the capacitors CL1 and CL2 affecting oscillations should be adjusted (manipulated).

In the oscillator of the first exemplary embodiment, as shown in FIG. 1, the resistance R3 is connected between the adjustment terminal 9 and ground terminal so that a current flowing through the current source 8 can be adjusted. The transconductance gm of the transistor Q1 can thus be adjusted. Consequently, the negative resistance $|-R|$ exhibited by the oscillation circuit 4 can be adjusted.

The idea of adjusting the load capacitances of the capacitors CL1 and CL2 is adopted in the subsequent exemplary embodiments to be described later. The adjustment will therefore be described later.

As mentioned above, in the oscillator of the first exemplary embodiment, the oscillation unit 2 consists of the oscillation circuit 4 and amplification circuit 5. The resistors R3 and R4 are placed on the periphery of the package and the current sources 8 and 12 are controlled independently of each other. Consequently, the negative resistance and the intensity of an oscillatory output are optimized relative to a user-specific resonant frequency. The oscillator in accordance with the first exemplary embodiment can be flexibly retrofitted to become usable for a wide range of applications and become compatible with different users' requests.

Next, an oscillator in accordance with a second exemplary embodiment of the present invention will be described with reference to FIG. 7.

Figure 7:
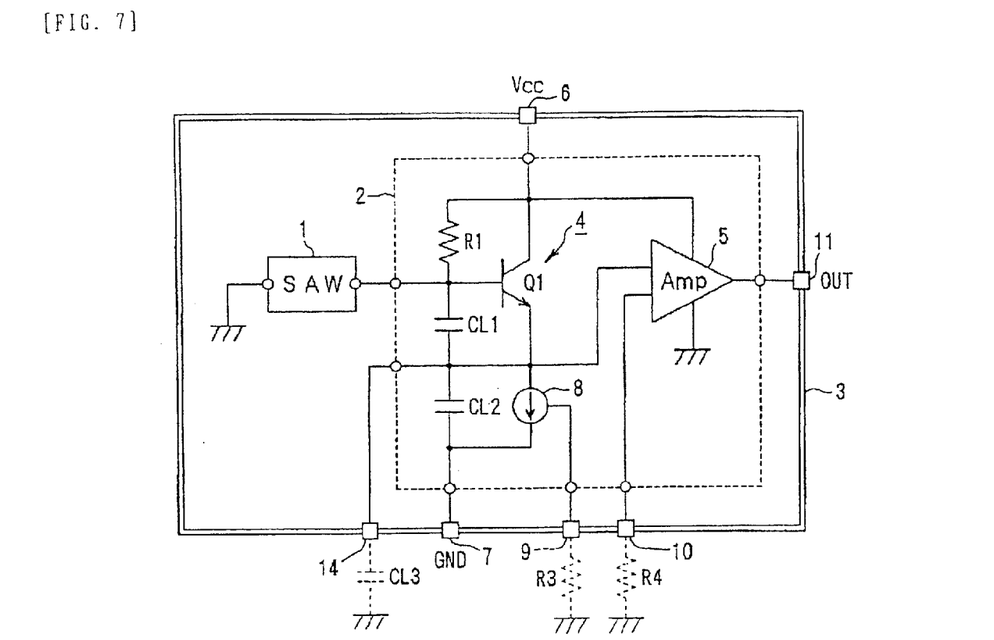
FIG. 7 is a circuit diagram showing the circuitry of an oscillator in accordance with the second exemplary embodiment of the present invention.

The oscillator in accordance with the second exemplary embodiment is, as shown in FIG. 7, provided with a negative resistance varying device for adjusting the capacitance of a capacitor CL2 that affects the oscillations of an oscillation circuit 4, and thus varying a negative resistance that affects the oscillations. The negative resistance varying device is realized with such a structure that an adjustment terminal 14 connected to a node between a capacitor CL1 and a capacitor CL2 is partly bared on the periphery of a package 3, and a capacitor CL3 is placed on the periphery thereof between the adjustment terminal 14 and a ground terminal. Incidentally, the other components of the oscillator in accordance with the second exemplary embodiment are identical to those of the oscillator in accordance with the first exemplary embodiment shown in FIG. 1. The same reference numerals will be assigned to the identical components. The description of the components will be omitted.

In the second exemplary embodiment having the foregoing components, when a user wants to change the capacitance of the capacitor CL2 so as to adjust a negative resistance, the capacitor CL3 is, as shown in FIG. 7, connected between the adjustment terminal 14 and ground terminal. Consequently, the capacitance of the capacitor CL2 is combined with the capacitance of the capacitor CL3, and thus increased. Thus, the negative resistance |−R| of the oscillation circuit 4 can be adjusted (see the equality (4)).

According to the second exemplary embodiment, the adjustment terminal 14 is included in addition to the adjustment terminals 9 and 10 employed in the first exemplary embodiment. Compared with the first exemplary embodiment, the negative resistance |−R| of the oscillation circuit 4 can be more finely adjusted. Nevertheless, the same advantages as those of the first embodiment can be exerted.

Next, an oscillator in accordance with a third exemplary embodiment of the present invention will be described with reference to FIG. 8.

Figure 8:
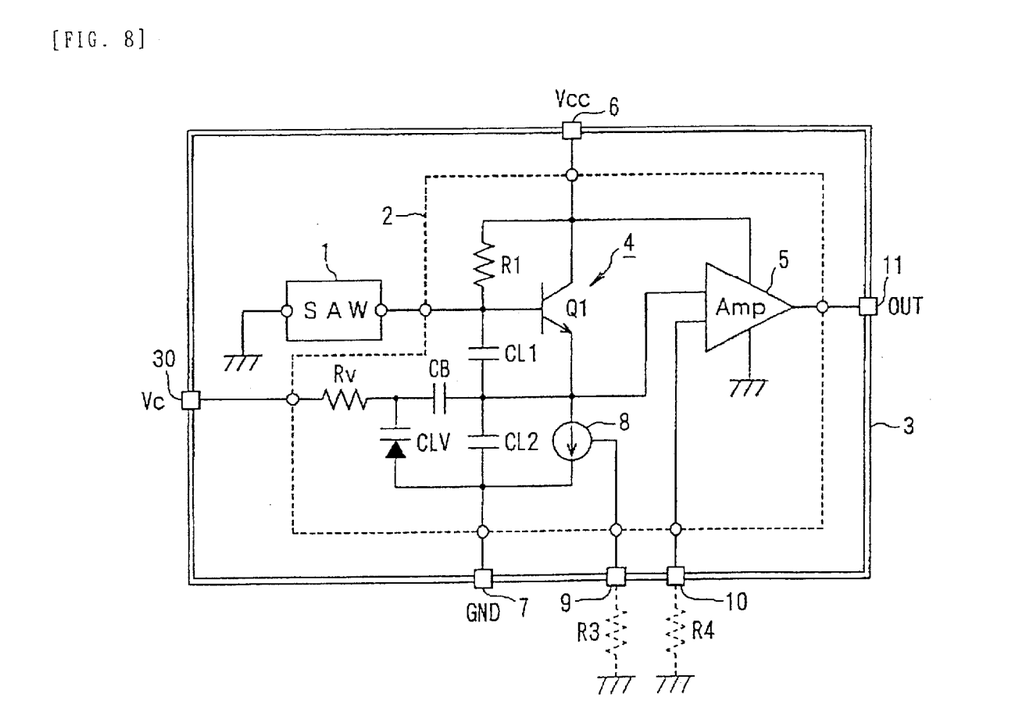
FIG. 8 is a circuit diagram showing the circuitry of an oscillator in accordance with the third exemplary embodiment of the present invention.

The oscillator in accordance with the third exemplary embodiment is, as shown in FIG. 8, provided with a negative resistance varying device for adjusting the capacitance of a capacitor CL2 that affects the oscillations of an oscillation circuit 4, and thus varying a negative resistance that affects the oscillations. The negative resistance varying means is realized with such a structure that a voltage control terminal 30 is partly bared on the periphery of a package 3, a variable capacitive element (varicap) CLV is connected via a dc cutting capacitor CB between a node between a capacitor CL1 and the capacitor CL2 and a ground terminal 7, and a node between the dc cutting capacitor CB and variable capacitive element CLV is connected to the voltage control terminal 30 via a protective resistor Rv.

Incidentally, the other components of the oscillator in accordance with the third exemplary embodiment are identical to those of the oscillator in accordance with the first exemplary embodiment shown in FIG. 1. The same reference numerals will be assigned to the identical components, and the description of the components will be omitted.

In the third exemplary embodiment having the foregoing components, the capacitance of the variable capacitive element CLV can be set freely depending on a voltage Vc to be applied to the voltage control terminal 30. The capacitance of the capacitor CL2 is combined with that of the variable capacitance element CLV, thus providing the composite capacitance (CLV+CL2). Consequently, the negative resistance |−R| of the oscillation circuit 4 can be adjusted (refer to the equality (4)).

As mentioned above, according to the third exemplary embodiment, the voltage control terminal 30 is included in addition to the adjustment terminals 9 and 10 employed in the first exemplary embodiment. Compared with the first exemplary embodiment, the negative resistance |−R| of the oscillation circuit 4 can be more finely adjusted. Besides, the same advantages as those of the first exemplary embodiment can be exerted.

Next, an oscillator in accordance with a fourth exemplary embodiment of the present invention will be described with reference to FIG. 9.

Figure 9:
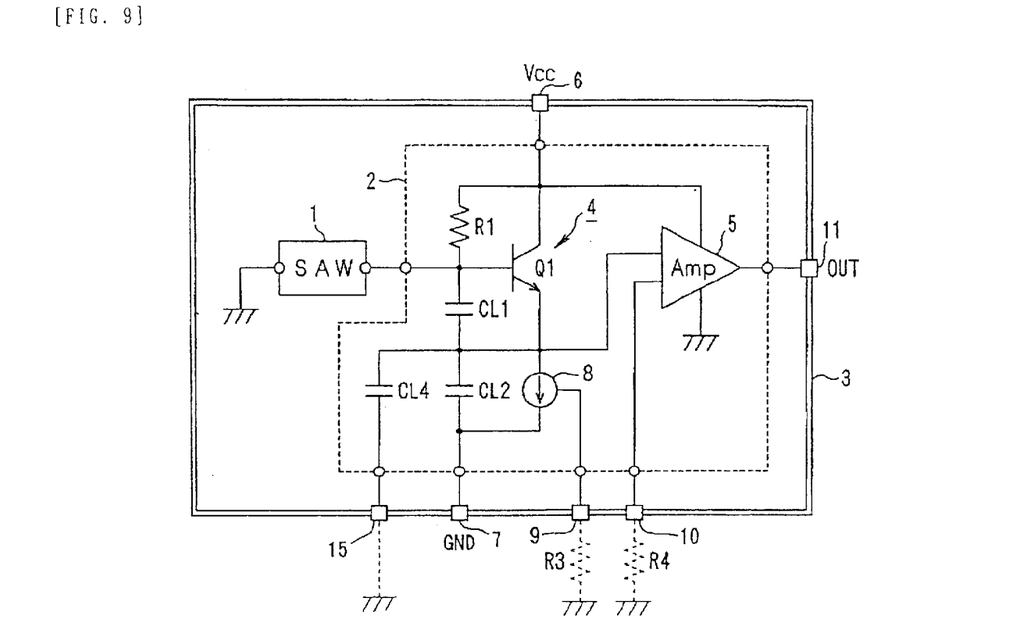
FIG. 9 is a circuit diagram showing the circuitry of an oscillator in accordance with the fourth exemplary embodiment of the present invention.

The oscillator in accordance with the fourth exemplary embodiment is, as shown in FIG. 9, provided with a negative resistance varying device for adjusting the capacitance of a capacitor CL2 that affects the oscillations of an oscillation circuit 4, and thus varying a negative resistance that affects the oscillations. The negative resistance varying device is realized with such a structure that an adjustment terminal 15 is partly bared on the periphery of a package 3, a capacitor CL4 is placed between a node between a capacitor CL1 and the capacitor CL2 and the adjustment terminal 15, and the capacitor CL4 is freely connected in parallel with the capacitor CL2, depending on whether the adjustment terminal 15 is grounded.

Incidentally, the other components of the oscillator in accordance with the fourth exemplary embodiment are identical to those of the oscillator in accordance with the first exemplary embodiment shown in FIG. 1. The same reference numerals will be assigned to the identical components, and the description of the components will be omitted.

In the fourth exemplary embodiment having the foregoing components, when a user wants to adjust the capacitance of the capacitor CL2 so as to adjust the negative resistance, the user should merely ground the adjustment terminal 15 as shown in FIG. 9. Consequently, the capacitance of the capacitor CL2 is combined with that of the capacitance CL4, and thus increased. The negative resistance |−R| of the oscillation circuit 4 is thus adjusted (refer to the equality (4)).

According to the fourth exemplary embodiment, the adjustment terminal 15 is included in addition to the adjustment terminals 9 and 10 employed in the first exemplary embodiment. Compared with the first exemplary embodiment, the negative resistance |−R| of the oscillation circuit 4 can be more finely adjusted. Besides, the same advantages as those of the first exemplary embodiment can be exerted.

Next, an oscillator in accordance with a fifth exemplary embodiment of the present invention will be described with reference to FIG. 10.

Figure 10:
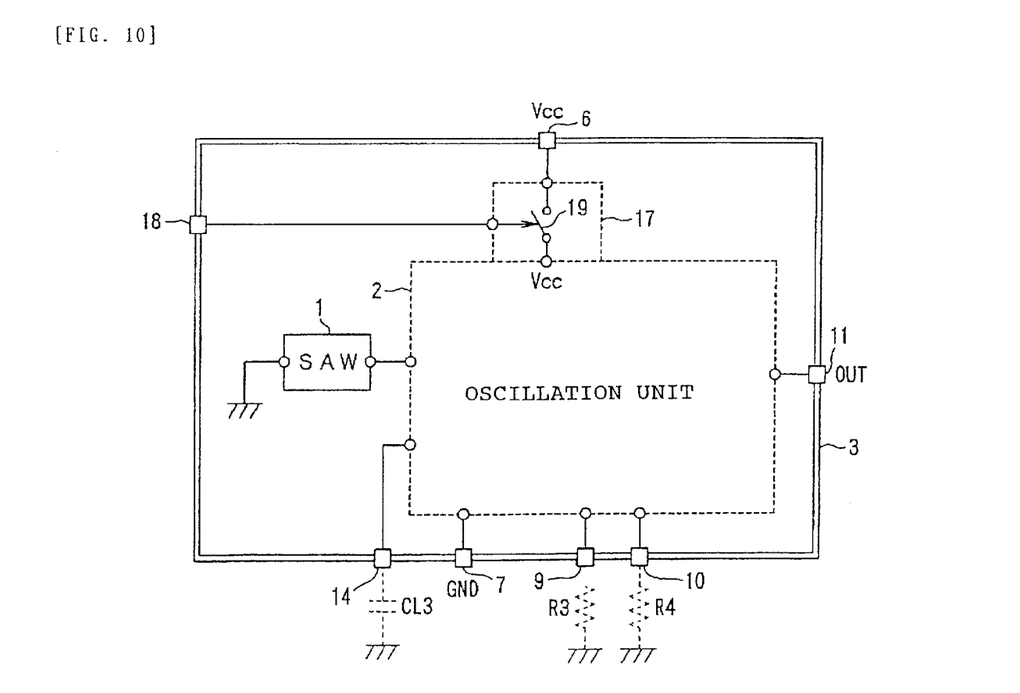
FIG. 10 is a block diagram showing the configuration of an oscillator in accordance with the fifth exemplary embodiment of the present invention.

The oscillator in accordance with the fifth exemplary embodiment includes, as shown in FIG. 10, an amplitude-shift keying (ASK) modulation circuit 17 that serves as a modulating device for modulating an oscillatory output of an oscillation circuit 4 included in an oscillation unit 2. Moreover, a modulation terminal 18 through which a modulating signal representing a bit 1 or 0 is input externally is partly bared on the periphery of a package 3.

The ASK modulation circuit 17 includes a switching element 19 interposed between a power supply terminal 6 and a power supply of the oscillation circuit 4. The switching element 19 is opened or closed according to a modulating signal input through the modulation terminal 18. The closing or opening of the switching element 19 enables or disables application of a voltage Vcc to the oscillation circuit 4. The switching element 19 is realized with, for example, a transistor. The modulating signal is input through the base of the transistor, whereby the transistor is turned on or off. Control is thus given to continue or discontinue application of the voltage Vcc to the oscillation circuit 4.

Incidentally, the other components of the oscillator in accordance with the fifth exemplary embodiment are identical to those of the oscillator in accordance with the second exemplary embodiment shown in FIG. 7. The same reference numerals will be assigned to the identical components, and the description of the components will be omitted.

According to the fifth exemplary embodiment, the ASK modulation circuit 17 for modulating an oscillatory output using a modulating signal received externally is included as a modulating device. The oscillator is therefore provided with the capability of a transmitter. Thus, a low-cost oscillator module usable for a wide range of applications can be provided for users.

Next, an oscillator in accordance with a sixth exemplary embodiment of the present invention will be described with reference to FIG. 11.

Figure 11:
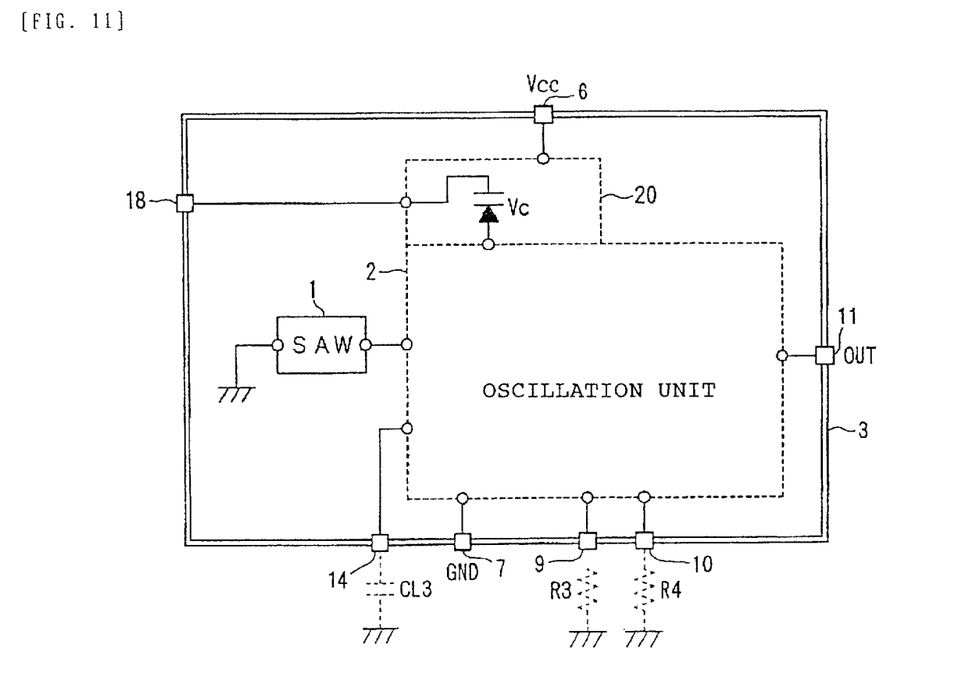
FIG. 11 is a block diagram showing the configuration of an oscillator in accordance with the sixth exemplary embodiment of the present invention.

The oscillator in accordance with the sixth exemplary embodiment includes, as shown in FIG. 11, a frequency-shift keying (FSK) modulation circuit 20 that serves as a modulating device for modulating an oscillatory output of an oscillation circuit 4 included in an oscillation unit 2. Moreover, the oscillator includes a modulation terminal 18 through which a modulating signal representing a bit I or 0 is input externally.

The FSK modulation circuit 20 is realized with a variable reactive circuit such as a varicap (variable capacitive element) Vc. A reactance offered by the varicap Vc is varied depending on a modulating signal input externally through the modulation terminal 18. Thus, the resonant frequency of the oscillation circuit 4 is varied.

Incidentally, the other components of the oscillator in accordance with the sixth exemplary embodiment are identical to those of the oscillator in accordance with the second exemplary embodiment shown in FIG. 7. The same reference numerals will be assigned to the identical components, and the description of the components will be omitted.

According to the sixth exemplary embodiment, the FSK modulation circuit 20 for modulating an oscillatory output according to an external modulating signal is included as a modulating device in order to provide the oscillator with the capability of a transmitter. Thus, a low-cost oscillator module usable for a wide range of applications can be provided for users.

Next, an oscillator in accordance with a seventh exemplary embodiment of the present invention will be described with reference to FIG. 12.

The oscillator in accordance with the seventh exemplary embodiment includes as a modulating device an ASK modulation circuit 17 or an FSK modulation circuit 20. Moreover, an output matching circuit 21 for matching the electrical characteristic of the oscillator with that of an antenna (not shown) is interposed between an amplification circuit 5 included in an oscillation unit 2 and an output terminal 11.

Figure 12:
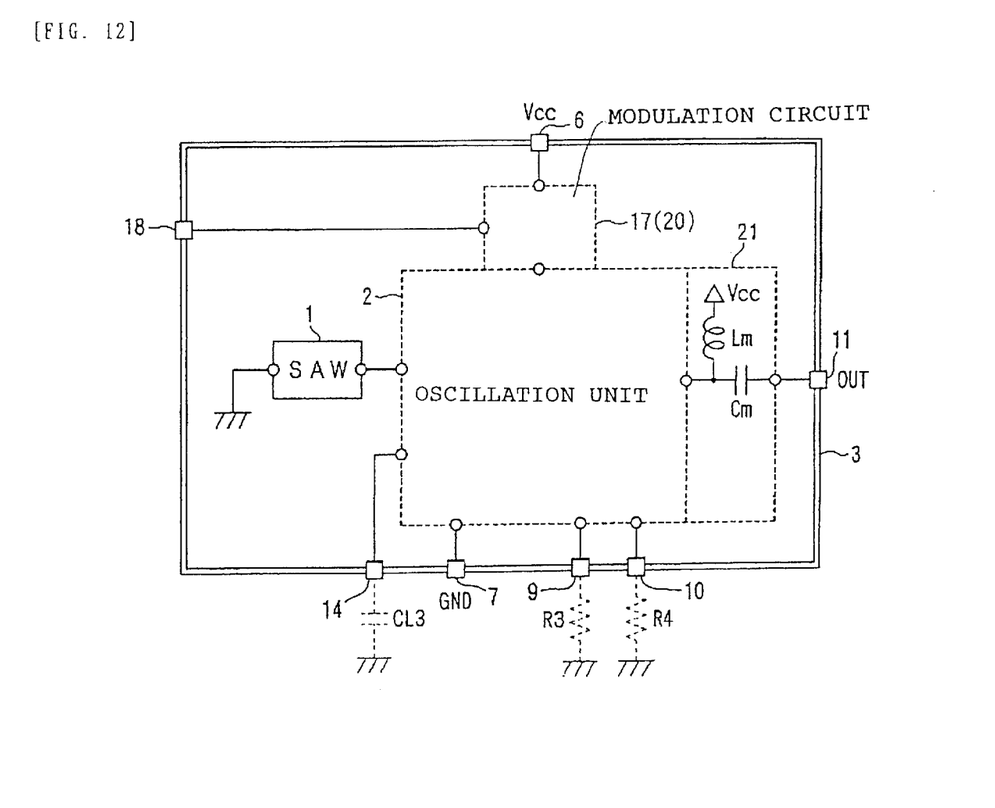
FIG. 12 is a block diagram showing the configuration of an oscillator in accordance with the seventh exemplary embodiment of the present invention.

The output matching circuit 21 is, like the example shown in FIG. 12, composed of an output matching coil Lm and an output matching capacitor Cm. An inductance offered by the coil Lm and a capacitance offered by the capacitor Cm are set to values permitting efficient transmission of an output of an amplification circuit 5 to the antenna. The practical circuitry is such that one terminal of the output matching coil Lm and one of the output matching capacitor Cm are connected to an output terminal of the amplification circuit 5, the other terminal of the output matching coil Lm is connected to a power supply terminal 6, and the other terminal of the output matching capacitor Cm is connected to the output terminal 11.

Incidentally, the other components of the oscillator in accordance with the seventh exemplary embodiment are identical to those of the oscillator in accordance with the fifth or sixth exemplary embodiment shown in FIG. 10 or 11. The same reference numerals will be assigned to the identical components, and the description of the components will be omitted.

According to the seventh exemplary embodiment, the output matching circuit 21 for matching the electrical characteristic of the oscillator with that of an antenna is included in addition to the modulating device such as the modulation circuit 17 or 20. The capability of a transmitter is thus further improved. Moreover, these components are encapsulated in the same package. According to the seventh exemplary embodiment, a transmitter having achieved saving of an occupied space and a reduction in costs can be realized owing to a few components formed on the periphery of the package.

Next, an oscillator in accordance with an eighth exemplary embodiment of the present invention will be described with reference to FIG. 13.

Figure 13:
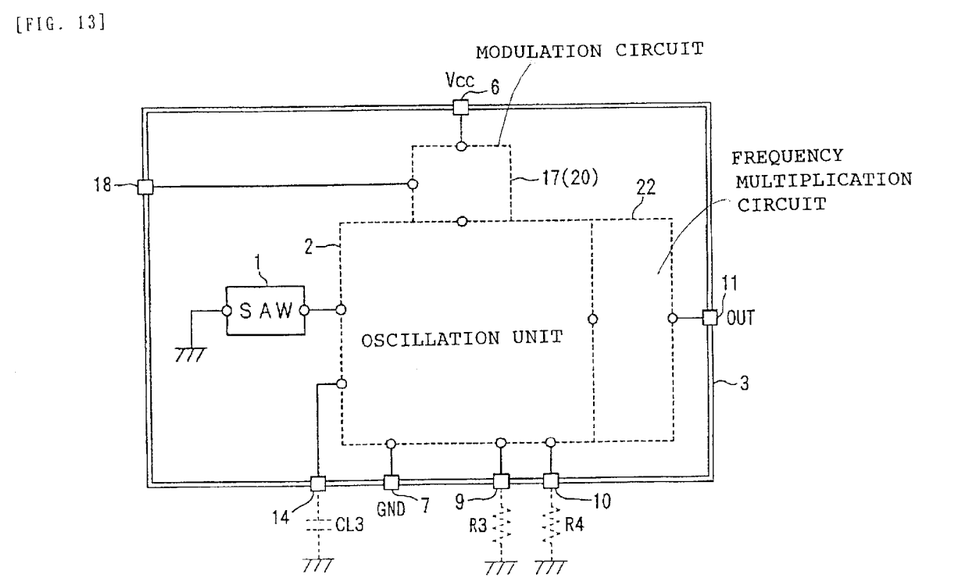
FIG. 13 is a block diagram showing the configuration of an oscillator in accordance with the eighth exemplary embodiment of the present invention.

The oscillator in accordance with the eighth exemplary embodiment includes, as shown in FIG. 13, an ASK modulation circuit 17 or an FSK modulation circuit 20 that serves as a modulating device. Moreover, a frequency multiplication circuit 22 as a frequency multiplying device for multiplying the frequency of an output of an oscillation unit 2 is interposed between an oscillation unit 2 and an output terminal 11. The frequency multiplication circuit 22 selects and outputs a harmonic having a frequency that is an integral multiple (for example, twice or three times as high as the fundamental frequency) of the fundamental frequency of an output signal provided by the oscillation unit 2.

Incidentally, the other components of the oscillator in accordance with the eighth exemplary embodiment are identical to those of the oscillator in accordance with the fifth or sixth exemplary embodiment shown in FIG. 10 or FIG. 11. The same reference numerals will be assigned to the identical components, and the description of the components will be omitted.

According to the eighth exemplary embodiment, the frequency multiplication circuit 22 for multiplying the frequency of an output provided by the oscillator 2 is included in addition to the modulating device such as the modulation circuit 17 or 20. This results in an oscillator oscillating in a wide frequency band, obviating user's concern about designing, enabling a reduction in costs, and being adaptable to a wide range of markets.

As described so far, according to various exemplary embodiments of this invention, a negative resistance varying device and an oscillatory output varying device may be included. The negative resistance varying device varies a negative resistance that affects the oscillations of an oscillation circuit, and the oscillatory output varying device varies the intensity of an output of the oscillation circuit. Consequently, a negative resistance and the intensity of an oscillatory output can be optimized relative to a user-requested resonant frequency. Thus, the oscillator can be flexibly retrofitted to become usable for a wide range of applications and become compatible with users' different requests.

The oscillation circuit above may include a reactive circuit, which is realized in the form of an integrated circuit, included in an oscillatory loop. A reactance offered by the reactive circuit can be arbitrarily adjusted externally. A user can therefore optimize the negative resistance of the oscillation circuit. Moreover, since the reactive circuit included in the oscillatory loop is realized in the form of an integrated circuit, a highly reliable oscillator can be realized while being unsusceptible to a stray capacitance introduced by any of circuit elements laid out according to a user-specific pattern. Furthermore, a user can design a high-frequency unit without concern. Thus, the oscillator will prove helpful.

According to other exemplary embodiments, an oscillator may be provided with the capability of a transmitter owing to inclusion of a modulating device. Consequently, a low-cost oscillator usable in a wide range of applications can be provided for users.

According to another exemplary embodiment, an output matching device for matching the electrical characteristic of an oscillator with that of an antenna may be included in addition to a modulating device. The capability of a transmitter may further be improved.

According to another exemplary embodiment, a frequency multiplying device may be included in addition to a modulating device. This may result in an oscillator oscillating in a wider frequency band, obviating user's concern about designing, enabling a reduction in costs, and being adaptable to a wide range of markets.

According to another exemplary embodiment, all components may be encapsulated in the same package. An oscillator or transmitter can be realized with an occupied space and costs saved.

According to another exemplary embodiment, predetermined components may be integrated into one circuit, and all components may be encapsulated in the same package. Consequently, an oscillator or a transmitter can be realized with an occupied space and costs saved.

What is claimed is:

1. An oscillator, comprising:

a surface acoustic wave (SAW) resonator;

an oscillation circuit that causes said SAW resonator to oscillate, said oscillation circuit further comprising a reactive circuit included in an oscillatory loop, which is realized in an integrated circuit, and the reactance of said reactive circuit being adjusted externally arbitrarily;

a negative resistance varying device that varies a negative resistance that affects oscillations of said oscillation circuit by adjusting a capacitance of a first capacitor, wherein an adjustment terminal is connected to a node between the first capacitor and a second capacitor; and an oscillatory output varying device that varies intensity of an output of said oscillation circuit.

2. The oscillator according to claim 1, said negative resistance varying device enabling external and independent adjustment of a reactance of the reactive circuit, affecting the oscillations of said oscillation circuit, and a current flowing through said oscillation circuit.

3. The oscillator according to claim 2, said reactive circuit comprising a variable capacitive element as an integral part thereof.

4. The oscillator according to claim 1, said oscillation circuit comprising a modulating device that modulates an oscillatory output of said oscillation circuit according to a modulating signal.

5. The oscillator according to claim 4, modulation form adopted by said modulating device being at least one of an amplitude-shift keying (ASK) modulation form and a frequency-shift keying (FSK) modulation form.

6. The oscillator according to claim 4, said oscillation circuit comprising in its output stage an output matching device that matches an impedance offered by said oscillation circuit with an impedance device offered by an external unit.

7. The oscillator according to claim 4, said oscillation circuit comprising in its output stage a frequency multiplying device that multiplies frequency of an output.

8. The oscillator according to claim 4, at least said SAW resonator, said oscillation circuit, and said modulating device being encapsulated in one package.

9. The oscillator according to claim 4, at least said SAW resonator, said oscillation circuit, and said modulating device being integrated into one circuit and encapsulated in one package.

* * * * *